United States Patent [19]

Kim

[11] Patent Number: 5,332,693
[45] Date of Patent: Jul. 26, 1994

[54] METHOD FOR MANUFACTURING ALUMINUM WIRED LAYER FOR INTERCONNECTING DEVICE TO DEVICE IN A SEMICONDUCTOR DEVICE

[75] Inventor: Jae K. Kim, Kyungki-do, Rep. of Korea

[73] Assignee: Hyundai Electronics, Industries Co., Ltd., Kyungki-do, Rep. of Korea

[21] Appl. No.: 884,037

[22] Filed: May 14, 1992

Related U.S. Application Data

[63] Continuation of Ser. No. 554,788, Jul. 18, 1990, abandoned.

[30] Foreign Application Priority Data

Jul. 20, 1989 [KR] Rep. of Korea ............... 89-10258

[51] Int. Cl.$^5$ .............................................. H01L 21/48
[52] U.S. Cl. ............................... 437/194; 437/192; 437/197
[58] Field of Search ............... 437/192, 194, 197; 357/65, 67, 71; 257/751, 763, 767

[56] References Cited

U.S. PATENT DOCUMENTS

| | | | |
|---|---|---|---|
| 4,267,012 | 5/1981 | Pierce et al. | 156/643 |
| 4,576,900 | 3/1986 | Chiang | 430/313 |
| 4,906,589 | 3/1990 | Chao | 437/41 |
| 4,910,580 | 3/1990 | Kuecher et al. | 357/71 |
| 4,948,459 | 8/1990 | van Laarhoven et al. | 357/71 |
| 4,980,752 | 12/1990 | Jones, Jr. | 357/71 |
| 4,988,423 | 1/1991 | Yamamoto et al. | 437/192 |

FOREIGN PATENT DOCUMENTS 62-296443 12/1987 Japan ........................ 357/71

OTHER PUBLICATIONS

Gardner, et al. "Layered and Homogeneous Films of Al and Al/Si with Ti and W for Multilevel Interconnects", IEEE Trans. on Elect. Dev. ED-32(2) (Feb. 1985) pp. 174-183.

Ghandhi, VLSI Fabrication Principles, John Wiley & Sons, pp. 497, 542-550, 1983.

*Primary Examiner*—Olik Chaudhuri
*Assistant Examiner*—C. Everhart
*Attorney, Agent, or Firm*—Merchant, Gould, Smith, Edell, Welter & Schmidt

[57] ABSTRACT

An improved aluminum wired layer for interconnecting a device to another device and which comprises a plurality of aluminum wired layers formed on an insulating layer of a semiconductor device and the method of manufacturing such aluminum wired layer is disclosed. The improvement of the aluminum wired layer comprises a plurality of aluminum wired layers positioned on the insulating layer, with each aluminum wired layer being spaced relative to each other and having a top, side walls and a bottom. A first Al-Ti compound metal layer is formed on the top and on the side walls of each aluminum wired layer to prevent the formation of hillock on the surface of each aluminum wired layer during the heat treatment process and to prevent electromigration phenomenon in each aluminum wired layer when the semiconductor device is in operation.

12 Claims, 4 Drawing Sheets

METHOD FOR MANUFACTURING ALUMINUM WIRED LAYER FOR INTERCONNECTING DEVICE TO DEVICE IN A SEMICONDUCTOR DEVICE

This is a continuation of U.S. application Ser. No. 07/554,788, filed Jul. 18, 1990, now abandoned.

BACKGROUND OF THE INVENTION

Field of the Invention

The present invention relates to an aluminum wired layer for interconnecting devices on a semiconductor device and a method of manufacturing an aluminum wired layer, and more particularly to an aluminum wired layer for interconnecting devices on a semiconductor device, with the aluminum wired layer being formed with an Al-Ti compound metal layer on the periphery of the aluminum wired layer, for example, top, bottom and side walls, and to a method of manufacturing such aluminum wired layer.

In general, in manufacturing a semiconductor device, the material of the aluminum wired layer interconnecting the devices for certain purposes formed inside the semiconductor device is a material which has excellent electric conductivity and which easily accepts the depositing process and the mask patterning process as final processes. Aluminum is the most widely used material.

The advantages of aluminum, in addition to the above description, are its good adherence to the top of the oxide film during the wiring process and its ability to bond with gold wire or aluminum wire. Further, aluminum is inexpensive.

On the other hand, aluminum has various problems. First, silicon diffuses from the silicon substrate into the aluminum wired layer at the junction positioned between the aluminum wired layer and the silicon substrate. This results in the formation of an undesirable pit in a portion of the junction which destroys the junction. This occurs when manufacturing an aluminum wired layer on a silicon substrate when heat (400–500 degree Celsius) is used to enhance the junction between the aluminum wired layer and the silicon substrate. This also occurs in other heat treatment processes, such as the depositing process (350–450 degree Celsius) where an insulation layer is deposited on the aluminum wired layer after the aluminum wired layer is formed on the silicon substrate. In view of the above, silicon is added, approximately 1% by weight, to the aluminum which will form the aluminum wired layer. The silicon is added to prevent the silicon of the substrate from diffusing into the aluminum wired layer during heat treatment of the aluminum wired layer. The metal barrier layer, such as TiW (Titanium - Tungsten) layer (10% Titanium/90% Tungsten) or TiN (Titanium - Nitride) layer can also be used to prevent the silicon of the substrate from diffusing into the aluminum wired layer during heat treatment of the aluminum wired layer deposited thereon.

Second, in the heat treatment process described above, a hillock of aluminum projecting from the surface of the aluminum wired layer occurs due to the difference in the thermal expansion coefficient between the aluminum wired layer and the substrate below the layer. Thus, when depositing a protecting film on the entire structure after the process of forming the aluminum wired layer for an internal connection line and performing the process of packaging the device, if the lithographic etching process utilizing a photoresist is performed for removing only a portion of the protecting film, such as for example, the bonding pad portion at which an aluminum wired layer for external connecting line is connected to the aluminum wired layer for internal connection line, the hillock causes a problem that the protecting film cannot protect against because the photoresist cannot cover completely the surface of the aluminum wired layer except for a portion of the bonding pad portion such that the protecting layer at the hillock is undesirably etched away. Furthermore, in the case of forming a multi-layered metal wired layer, a pin hole is produced at the insulating layer due to the hillock so that the lower aluminum wired layer and the upper aluminum wired layer are electrically connected to each other at an undesirable position rendering the device inoperable.

Third, when the device operates, the flow of electric current in the aluminum wired layer results in an electromigration phenomenon in which the atoms of the aluminum move so that the aluminum wired layer becomes disconnected.

One of the methods of the prior art to solve hillock formatting on the surface of the aluminum wired layer and the problem of the electromigration is to deposit an aluminum layer and a titanium layer in sequence, as shown in FIG. 1. A plurality of the aluminum wired layers is then formed by removing certain portions of the aluminum and the titanium layers by the mask patterning process. An Al-Ti compound metal layer is formed on the top of the aluminum wired layer by heat treatment. The Al-Ti compound metal layer restrains the occurrence of hillock formation and reduces the electromigration phenomenon. In the prior art process the Al-Ti compound metal layer is obtained by heat treatment of the aluminum wired layer and the titanium layer at the temperature of about 350–450 degree Celsius. It is noted that if the silicon is added in the order of less that 2% by weight in the aluminum, the Al-Ti compound metal layer is composed of the $Al_3Ti$.

However, with the prior art method, while the hillock on the top of the aluminum wired layer can be restrained, the hillock projected from the side wall of the aluminum wired layer cannot be restrained. However, the spacing between the adjacent aluminum wired layers is small making adjacent layers undesirably connected to each other where the hillock occurs at the side wall. This results in a failure of the device.

Therefore, an object of the present invention is to provide an aluminum wired layer for connecting device to device in a semiconductor device constructed in such a way that the Al-Ti compound metal layer is formed over the entire exposed surface of the top, bottom and side walls of the aluminum wired layer.

A further object of the present invention is to provide a method for forming a protected aluminum wired layer.

A further object of the present invention is to provide an aluminum wired layer for connecting device to device which restrains the occurrence of hillock formation not only on the top but also on the side walls of the aluminum wired layer.

A further object of the present invention is to provide an aluminum wired layer for connecting device to device which prevents the occurrence of the destruction of the junction between the aluminum wired layer and the silicon substrate, and which prevents the electromigration phenomenon in the aluminum wired layer.

The preceeding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The aluminum wire layer for interconnecting device to device in a semiconductor device of the present invention is defined by the claims with a specific embodiment shown in the attached drawings. For the purpose of summarizing the invention, the invention relates to an improvement in an aluminum wired layer for interconnecting device to device which comprises a plurality of aluminum wired layers formed on an insulating layer of a semiconductor device. The improvement of the aluminum wired layer comprises a plurality of aluminum wired layers on the insulating layer, with each aluminum wired layer being spaced relative to each other and having a top, side walls and a bottom, respectively. A first Al-Ti compound metal layer is formed on the top and on the side walls of each aluminum wired layer to prevent the formation of hillock on the surface of each aluminum wired layer during the heat treatment and to prevent electromigration phenomenon in each aluminum wired layer when the semiconductor device is in operation.

The aluminum wired layer according to the present invention further include a second Al-Ti compound metal layer formed on each bottom of each aluminum wired layer of the plurality of aluminum wired layers.

A further embodiment of the present invention includes an aluminum wired layer for interconnecting device to device comprising a plurality of aluminum wired layers formed on a silicon substrate of a semiconductor device, wherein the improvement of the aluminum wired layer comprises a plurality of aluminum wired layers on the silicon substrate, with each aluminum wired layer being spaced apart relative to each other and having a top, side walls and a bottom. A first Al-Ti compound metal layer is formed on the top and side walls of each aluminum wired layer of the plurality of aluminum wired layers. A metal barrier layer is formed on each bottom of each aluminum wired layer of the plurality of aluminum wired layers to prevent the formation of a pit occurring at a junction between the silicon substrate and each aluminum wired layer during heat treatment and to prevent electromigration phenomenon in each aluminum wired layer when the semiconductor device is in operation.

This embodiment may further include a second Al-Ti compound metal layer formed on the bottom of each aluminum wired layer of the plurality of aluminum wired layers. A metal barrier layer formed between the silicon substrate and each second Al-Ti compound metal layer of each aluminum wired layer of the plurality of aluminum wired layers thereby restraining electromigration phenomenon and preventing the formation of hillock on the surface of each aluminum wired layer during heat treatment. The preferred metal barrier layer are a Titanium - Tungsten layer having a composite rate of 10-90 percentage and a Titanium - Nitrogen layer.

The present invention further includes a method for manufacturing an aluminum wired layer for interconnecting device to device comprising a plurality of aluminum wired layers formed on an insulating layer of a semiconductor device, wherein the improvement of the aluminum wired layer comprises depositing an aluminum layer on the insulating layer and then etching the aluminum layer deposited on the surface of the insulating layer to form a plurality of aluminum wired layers with each aluminum wired layer being spaced apart relative to each other on the insulating layer exposed by the formation of the plurality of aluminum wired layers and with each aluminum wired layer having a top and side walls. A titanium layer is then deposited on the entire surface of the structure including each aluminum wired layer and the exposed portion of the insulating layer. The titanium layer is heated thereby reacting the titanium of the titanium layer positioned on each aluminum wired layer with the aluminum of each aluminum wired layer, to provide a first Al-Ti compound metal layer on the top and side walls of the each aluminum wired layer to prevent the formation of hillock on the surface of each aluminum wired layer during the heat treatment of the titanium layer and to prevent electromigration phenomenon in each aluminum wired layer when the semiconductor device is in operation. The titanium layer remaining on the exposed portion of the insulating layer is selectively removed.

The titanium layer is heated at a temperature of 400-500 degree Celsius simultaneously with application of conditioning gases wherein the conditioning gas is selected form the group consisting of: a nitrogen-hydrogen gas mixture, nitrogen gas or argon gas.

The titanium layer which remains on the exposed portion of the insulating layer is selectively removed by etching the remaining titanium layer in an etchant of $NH_4OH/H_2O_2/H_2O$ having a composite ratio of 1:1:5 having a temperature of 18-40 degree Celsius.

The present invention further includes a method for manufacturing an aluminum wired layer for interconnecting device to device comprising a plurality of aluminum wired layers formed on an insulating layer of a semiconductor device, wherein the improvement of the aluminum wired layer comprises sequentially depositing a first titanium layer and an aluminum layer on the insulating layer. The first titanium layer and the aluminum layer deposited on the surface of the insulating layer are etched to form a plurality of aluminum wired layers with each aluminum wired layer being spaced apart relative to each other on the insulating layer exposed by the formation of the plurality of aluminum wired layers and with each aluminum wired layer having a top, a bottom and side walls. A second titanium layer is deposited on the entire surface of the structure including each aluminum wired layer and on the exposed portion of the insulating layer. The first and second titanium layers are heated thereby reacting the titanium of the first and second titanium layers positioned on each aluminum wired layer and at the bottom thereof with the aluminum of each aluminum wired layer thereby providing a first Al-Ti compound metal layer on the top and side walls of each aluminum wired layer and a second Al-Ti compound metal layer at the bottom thereof to prevent the formation of hillock on the surface of each aluminum wired layer during the heat treatment and to prevent electromigration phenomenon in each aluminum wired layer when the semiconductor device is in operation. The second titanium layer remaining on the exposed portion of the insulating layer is selectively removed.

The first and the second titanium layers are preferably heated at a temperature of 400–500 degree Celsius simultaneously with application of conditioning gases wherein the conditioning gas is selected form the group consisting of: a nitrogen-hydrogen gas mixture, nitrogen gas or argon gas.

The second titanium layer remaining on the exposed portion of the insulating layer is selectively removed by etching the remaining titanium layer in an etchant of $NH_4OH/H_2O_2/H_2O$ having a composite ratio of 1:1:5 and having a temperature of 18–40 degree Celsius.

The present invention further includes a method for manufacturing an aluminum wired layer for interconnecting device to device comprising a plurality of aluminum wired layers formed on a silicon substrate of a semiconductor device, wherein the improvement of the aluminum wired layer comprises sequentially depositing a metal layer and an aluminum layer on the silicon substrate. The aluminum layer and the metal layer deposited on the surface of the silicon substrate are etched to form a plurality of aluminum wired layers with each aluminum wired layer being positioned on a metal barrier layer and spaced apart relative to each other on the silicon substrate exposed by the formation of the plurality of aluminum wired layers and with each aluminum wired layer having a top, a bottom and side walls. A titanium layer is deposited on the entire surface of the structure including on the each aluminum wired layer and on the exposed portion of the silicon substrate. The titanium layer is heated thereby reacting the titanium of the titanium layer positioned on the each aluminum wired layer with the aluminum of the each aluminum wired layer to provide a first Al-Ti compound metal layer on the top and side walls to prevent the formation of a pit occurring at a junction between the silicon substrate and each aluminum wired layer during heat treatment and to prevent electromigration phenomenon in each aluminum wired layer when the semiconductor device is in operation. The remaining titanium layer on the exposed portion of the silicon substrate is then selectively removed.

Preferably, the titanium layer is heated at a temperature of 400–500 degree Celsius simultaneously with application of conditioning gases wherein the conditioning gas is selected form the group consisting of: a nitrogen-hydrogen gas mixture, nitrogen gas or argon gas.

The titanium layer remaining on the exposed portion of the insulating layer is selectively removed by etching the remaining titanium layer in an etchant of $NH_4OH/H_2O_2/H_2O$ having a composite ratio of 1:1:5 having a temperature of $18 \propto 40$ degree Celsius.

A further embodiment of the present invention includes a method for manufacturing an aluminum wired layer for interconnecting device to device comprising a plurality of aluminum wired layers formed on a silicon substrate of a semiconductor device, wherein the improvement of the aluminum wired layer comprises sequentially depositing a metal layer, a first titanium layer and an aluminum layer on the silicon substrate. The aluminum layer, the first titanium layer and the metal layer deposited on the surface of the silicon substrate are then etched to form a plurality of aluminum wired layers with each aluminum wired layer being positioned on a metal barrier layer and spaced apart relative to each other on the silicon substrate exposed by the formation of the plurality of aluminum wired layers. Each aluminum wired layer has a top, a bottom and side walls. A second titanium layer is deposited on the entire surface of the structure including each aluminum wired layer and on the exposed portion of the silicon substrate. The first and second titanium layers are heated thereby reacting the titanium of the first and second titanium layers positioned on each aluminum wired layer and at the bottom thereof with the aluminum of the each aluminum wired layer, to provide a first Al-Ti compound metal layer on the top, side walls and a second Al-Ti compound metal layer on the bottom of the each aluminum wired layer to prevent the formation of a pit occurring at a junction between the silicon substrate and each aluminum wired layer during heat treatment and to prevent electromigration phenomenon in each aluminum wired layer when the semiconductor device is in operation. The second titanium layer remaining on the exposed portion of the silicon substrate is then selectively removed.

Preferably, the first and the second titanium layers are heated at a temperature of 400–500 degree Celsius simultaneously with application of conditioning gases wherein the conditioning gas is selected form the group consisting of: a nitrogen-hydrogen gas mixture, nitrogen gas or argon gas.

The second titanium layer remaining on the exposed portion of the insulating layer is selectively removed by etching the remaining titanium layer in an etchant of $NH_4OH/H_2O_2/H_2O$ having a composite ratio of 1:1:5 having a temperature of 18–40 degree Celsius.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be made to the following detailed description taken in conjunction with the accompanying drawings in which.

The novel feature of the present invention may be understood from the accompanying description when taken in conjunction with the accompanying drawing.

DETAILED DESCRIPTION OF THE DRAWINGS

While the invention has been described with respect to the preferred embodiments using an aluminum wired layer and an aluminum wired layer with an aluminum wired layer formed on an insulating layer or a silicon substrate. It should be noted that the invention can applies to a semiconductor device in which the aluminum wired layer is used as a transistor, capacitor or resistor, etc.

Figure 1:
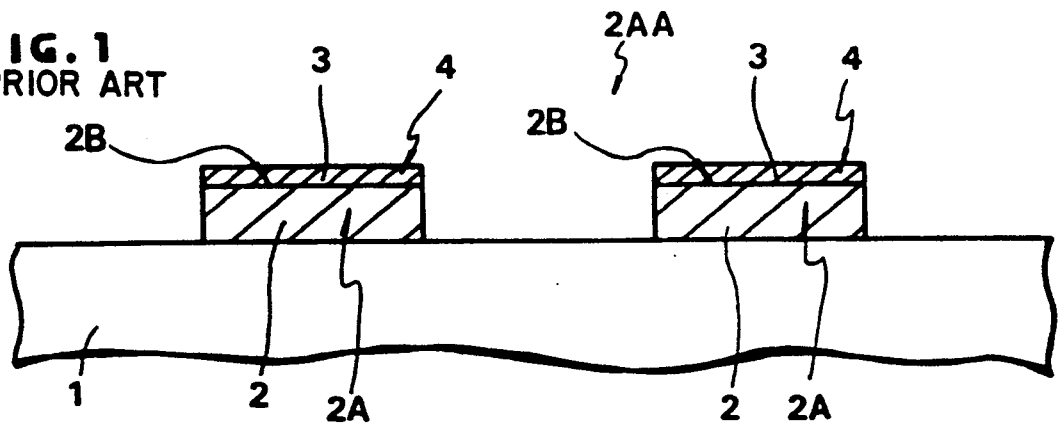
FIG. 1 illustrates a cross sectional view of a metal wired layer according to the prior art.

FIG. 1 illustrates a cross sectional view of an aluminum wired layer according to the prior art. Referring to the drawing, an aluminum layer 2 and a titanium layer 3 are sequentially deposited on an insulating layer 1. By the mask patterning process, the aluminum layer 2 and the titanium layer 3 are sequentially etched to provide a plurality of aluminum wired layers 2AA, with each aluminum wired layer 2A having a top 2B and being spaced apart relative to each other on the insulating layer 1.

The plurality of aluminum wired layers 2AA on the insulating layer 1 are heated in a furnace, not shown, which is supplied with conditioning gases as described below, to cause the titanium to react with the aluminum in the each aluminum wired layer 2A, thereby forming an Al-Ti compound metal layer 4 on each of top 2B of each aluminum wired layer 2A.

As described above, since the resultant structure of the aluminum wired layer according to the prior art has the Al-Ti compound metal layer 4 formed directly on the top 2B of the each aluminum wired layer 2A, the problem of hillock formation at the side wall of the aluminum wired layer during heat treatment cannot be avoided.

The first embodiment of the present invention provides a structure having a first Al-Ti compound metal layer 4A formed on the top 2B and side walls 2C of the each aluminum wired layer 2A. "Side walls" is used to describe the walls of the wired layer. Such wired layer includes the long side walls typical of a wired layer and the terminal walls which are typically very short relative to the side walls. The purpose of the present invention is to prevent the problems described above. Thus, all the walls of the wired layer are protected according to the present invention. The second embodiment of the present invention provides a structure having a first Al-Ti compound metal layer 4A formed on the top 2B, bottom 2D and side walls 2C of the each aluminum wired layer 2A.

Figure 2A:
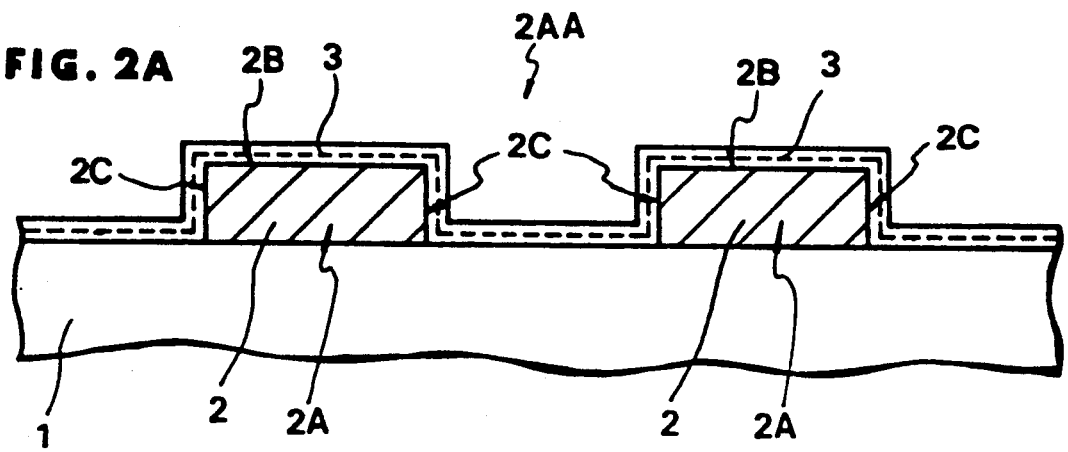
FIGS. 2A through 2C illustrate cross sectional views of partially completed aluminum wired layer utilizing the process steps according to a first embodiment of the present invention for manufacturing an aluminum wired layer.
Figure 2B:
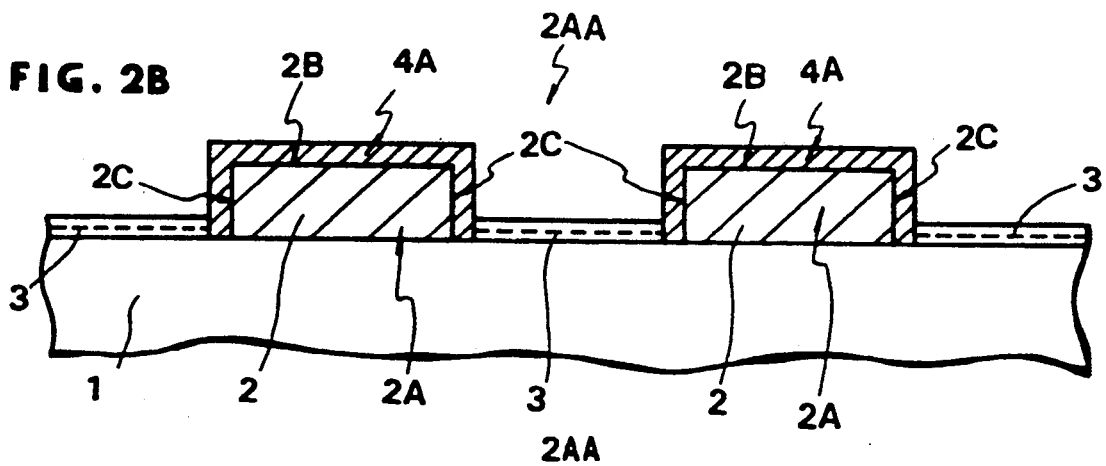
Figure 2C:
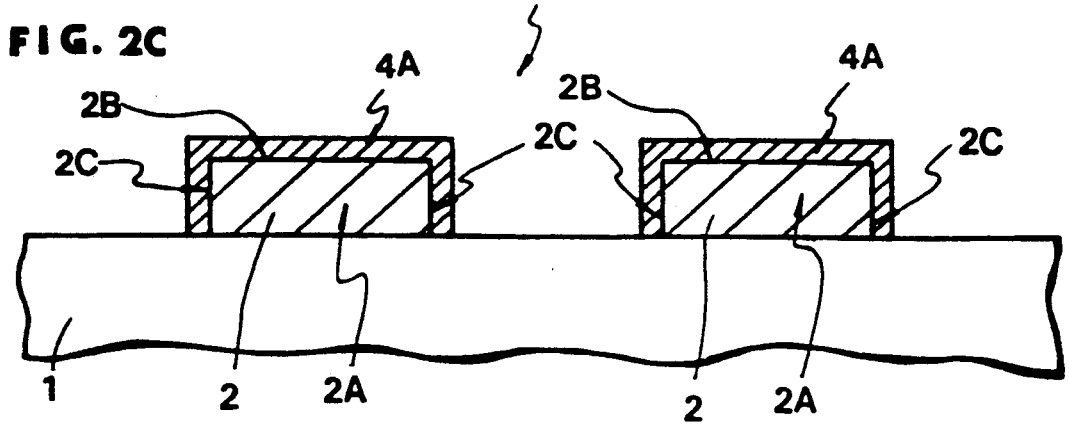

FIGS. 2A through 2C are sectional views of partially completed aluminum wired layers according to the process steps of the first embodiment of the present invention for manufacturing an aluminum wired layer on the insulating layer 1. The metal wire layer produced by the first embodiment of the present invention effectively prevents hillock formation at the top and side walls of the aluminum wired layer.

Referring to FIG. 2A, to form a plurality of aluminum wired layers 2AA, an aluminum layer 2 is deposited on the entire surface of the insulating layer 1. By the mask patterning process, the aluminum layer 2 is etched to provide a plurality of aluminum wired layers 2AA, with each aluminum wired layer 2A being spaced apart relative to each other and having a top 2B and side walls 2C, on the insulating layer 1. A titanium layer 3 is then deposited on the entire surface of the structure as illustrated at FIG. 2A. The titanium layer 3 described in connection with FIG. 2A is heated in a furnace, not shown, at a temperature of 400–500 degree Celsius simultaneously with application of conditioning gases, such as for example, a nitrogen-hydrogen gas mixture, nitrogen gas or argon gas. This causes the titanium in the titanium layer 3 to react with the aluminum in the each aluminum wired layer 2A, of the plurality of aluminum wired layers 2AA, to form a first Al-Ti compound metal layer 4A on each aluminum wired layer 2A of the plurality of aluminum wired layers 2AA. As illustrated at FIG. 2B, layer 4A covers the top 2B and side walls 2C of each aluminum wired layer 2A. The portion of the titanium layer 3 which was deposited on the insulating layer 1 exposed in the preparation of the plurality of aluminum wired layers 2AA, remains, as illustrated at FIG. 2B.

In order to selectively remove that portion of the titanium layer 3 which remains on the insulating layer 1, an etching process is performed on the resultant structure of FIG. 2B, utilizing an etchant of $NH_4OH/H_2O_2/H_2O$ (composite rate, 1:1:5) which is at a temperature of 18–40 degree Celsius. This results in the top 2B and side walls 2C of each aluminum wired layer 2A being coated with the first Al-Ti compound metal layer 4A and the insulating layer 1 being exposed where the titanium layer 3 has been etched away, as illustrated at FIG. 2C.

FIGS. 3A through 3D are sectional views of a partially completed aluminum wired layer utilizing the process steps according to a second embodiment of the present invention for manufacturing an aluminum wired layer on an insulating layer 1. The aluminum wired layer produced by the second embodiment of present invention effectively restrains electromigration phenomenon as well as hillock formation in the aluminum wired layer as compared to the prior art aluminum wired layer described in the opening paragraph.

Figure 3A:
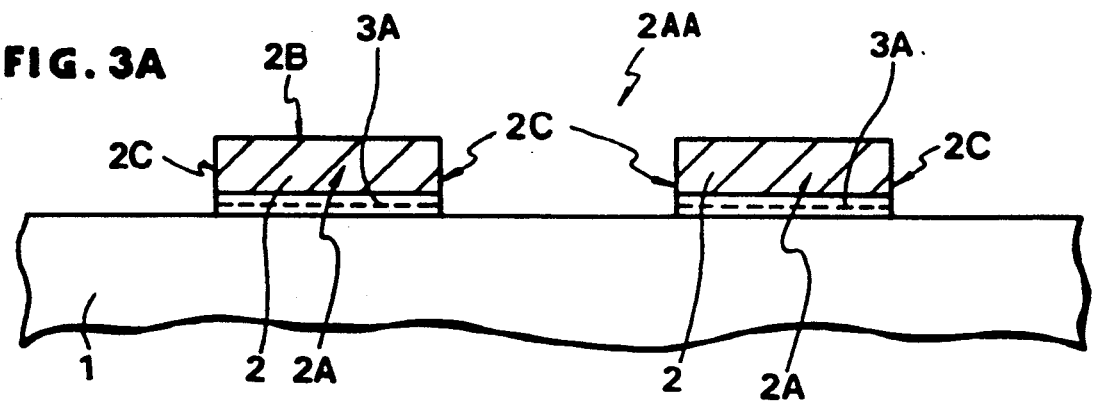
FIGS. 3A through 3D illustrate cross sectional views of partially completed aluminum wired layer utilizing the process steps according to a second embodiment of the present invention for manufacturing an aluminum wired layer.

To form a plurality of aluminum wired layers 2AA, a first titanium layer 3A and an aluminum layer 2 are sequentially deposited over the insulating layer 1. By the mask patterning process, the aluminum layer 2 and the first titanium layer 3A are etched to provide a plurality of aluminum wired layers 2AA, with each aluminum wired layer 2A being spaced apart relative to each other and having a top 2B and side walls 2C, on the insulating layer 1 as illustrated at FIG. 3A.

Figure 3B:
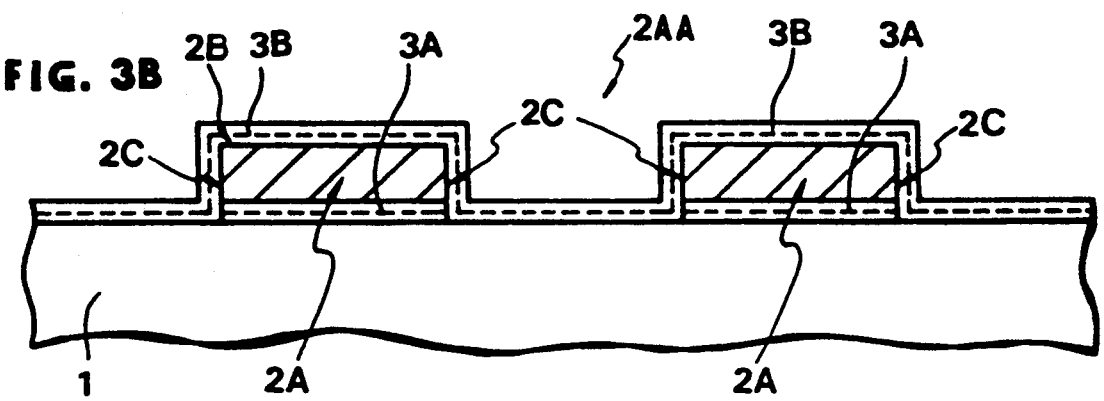

FIG. 3B illustrates a second titanium layer 3B deposited on the entire surface of the structure described in connection with FIG. 3A.

The first 3A and second 3B titanium layers are heated in a furnace, not shown, at a temperature of 400–500 degree Celsius simultaneously with application of conditioning gases, such as for example, a nitrogen-hydrogen gas mixture, nitrogen gas or argon gas, to cause the titanium in the first 3A and second 3B titanium layers to react with aluminum 2 in the each aluminum wired layer 2A of the plurality of aluminum wired layers 2AA.

First and second Al-Ti compound metal layers 4A, 4B are thus formed on each aluminum wired layer 2A of the plurality of aluminum wired layers 2AA, i.e. layers 4A, 4B cover the top 2B and side walls 2C and the bottom 2D of each aluminum wired layer 2A. The titanium layer 3B which was deposited on the exposed portion of the insulating layer 1, remains, as illustrated at FIG. 3C.

Figure 3C:
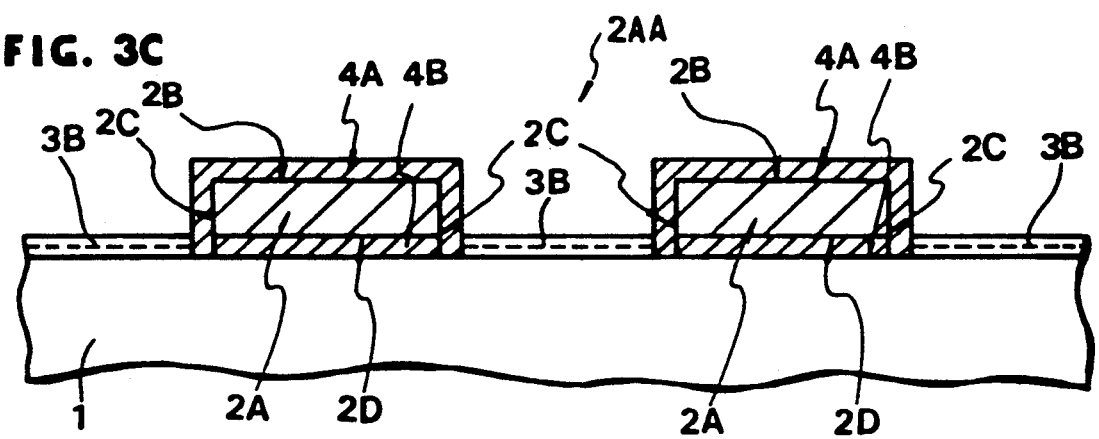
Figure 3D:
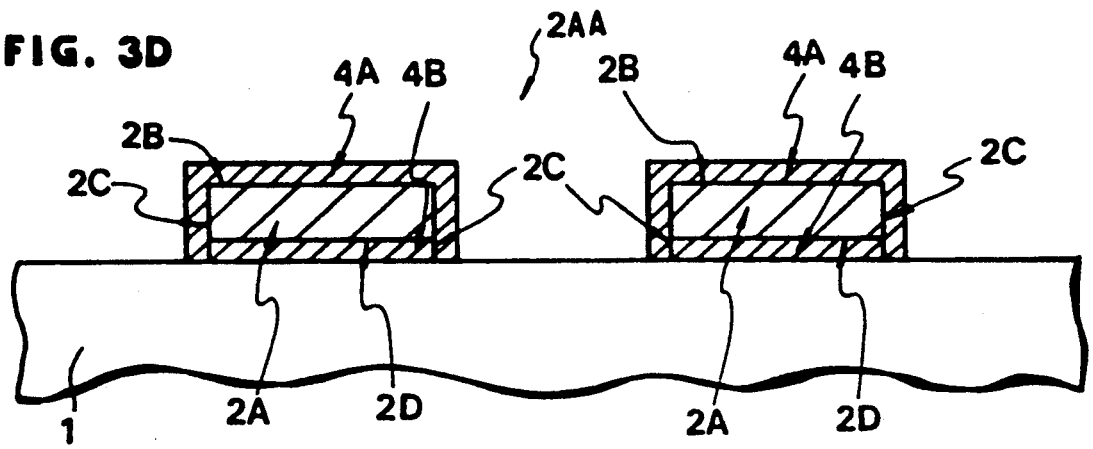

In order to selectively remove the second titanium layer 3B which remains on the insulating layer 1, an etching process is performed on the resultant structure of FIG. 3C, utilizing an etchant of $NH_4OH/H_2O_2/H_2O$ (composite rate, 1:1:5) which is at a temperature of 18–40 degree Celsius. This results in the top 2B, bottom 2D and side walls 2C of each aluminum wired layer 2A being coated with the first and second Al-Ti compound metal layers 4A, 4B and the insulating layer 1 being exposed where the second titanium layer 3B was etched away, as illustrated at FIG. 3D.

Figure 4A:
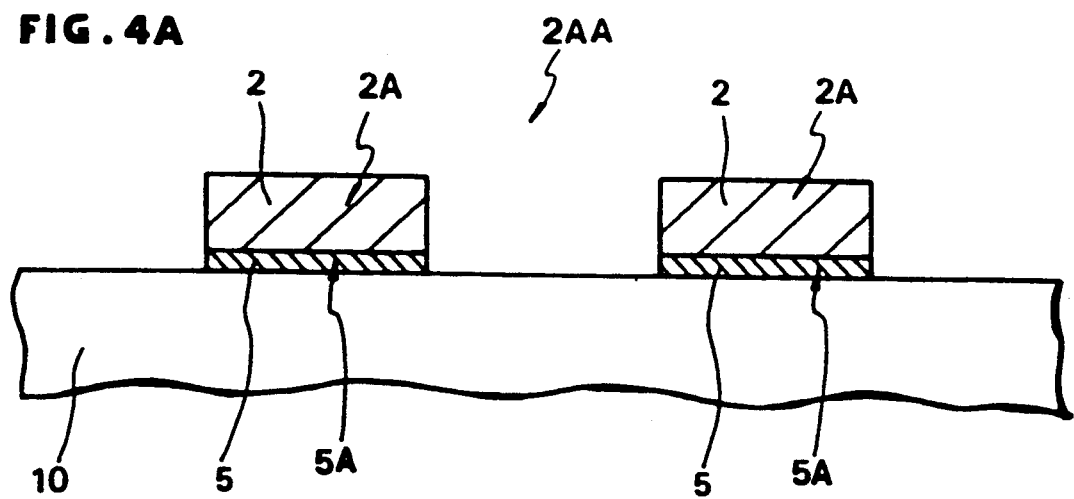
FIGS. 4A through 4C illustrate cross sectional views of partially completed aluminum wired layer utilizing the process steps according to a third embodiment of the present invention for manufacturing an aluminum wired layer.
Figure 4B:
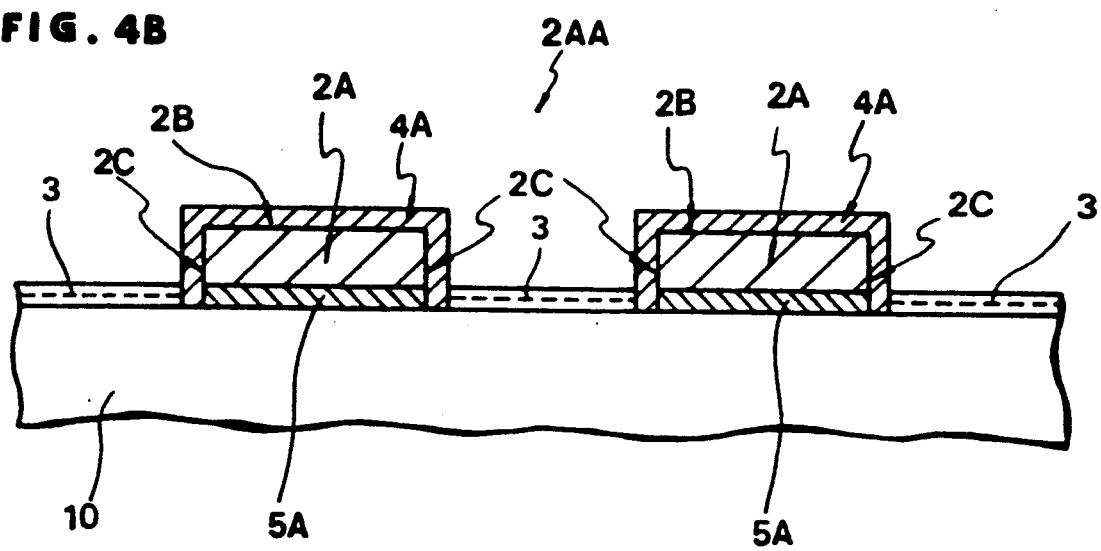
Figure 4C:
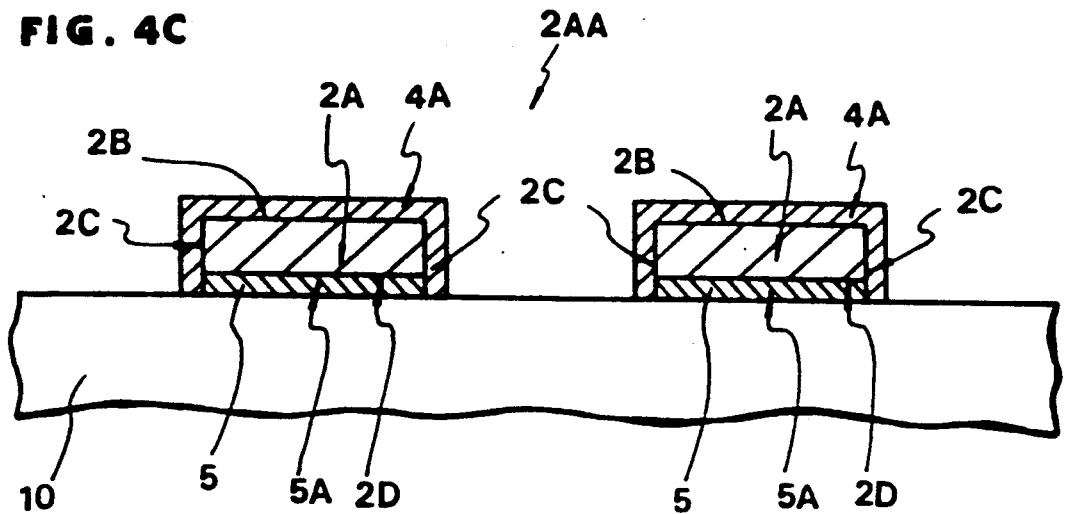

FIGS. 4A through 4C are sectional views of partially completed aluminum wired layer utilizing the process steps for manufacturing the aluminum wired layer on a silicon substrate 10 according to a third embodiment of the present invention. FIGS. 2A through 2C and FIGS. 3A through 3D, above, describe forming aluminum wired layers on an insulating layer.

The third embodiment of the present invention provides a structure having a metal barrier layer 5A, such as for example, TiW, formed at the bottom 2D of each aluminum wired layers 2A where the aluminum wired layer 2A is formed on the silicon substrate and having a first Al-Ti compound metal layer 4 formed on the top 2B and side walls 2C of each aluminum wired layer 2A. The reason why the metal barrier layer 5 is formed at the bottom 2D of each aluminum wired layer 2A of the third embodiment is to solve the draw back of the previously mentioned prior art aluminum wired layers 2A by preventing the occurrence of the formation of a pit at the junction between the silicon substrate and the each aluminum wired layers during heat treatment.

To form a plurality of aluminum wired layers 2AA, a metal layer 5, such as for example, TiW, and a aluminum layer 2 are sequentially deposited over the silicon substrate 10. By the mask patterning process, the aluminum layer 2 and the metal layer 5 are etched to provide a plurality of aluminum wired layers 2AA, with each aluminum wired layer 2A being spaced apart relative to each other and having a top 2B, bottom 2D and side walls 2C, and to provide a metal barrier layer 5A formed at the bottom 2D of the each aluminum wired layer 2A as illustrated at FIG. 4A.

FIG. 4B illustrates a titanium layer 3 deposited on the entire surface of the structure described in connection with FIG. 4A.

The titanium layer 3 is heated in a furnace, not shown, at a temperature of 400–500 degree Celsius simultaneously with application of conditioning gases, such as for example, a nitrogen-hydrogen gas mixture, nitrogen gas or argon gas, to cause the titanium in the titanium layer 3 to react with aluminum in the each aluminum wired layer 2A of the plurality of aluminum wired layers 2AA. A first Al-Ti compound metal layers 4A is thus formed on each aluminum wired layer 2A of the plurality of aluminum wired layers 2AA, i.e. layer 4A covers the top 2B and side walls 2C of each aluminum wired layer 2A, and the metal barrier layer 5A is also formed at the each aluminum wired layer 2A of the plurality of aluminum wired layers 2AA. The titanium layer 3 which was deposited on the exposed portion of the silicon substrate 10, remains, as illustrated at FIG. 4B.

In order to selectively remove the titanium layer 3 which remains on the silicon substrate 10, an etching process is performed on the resultant structure of FIG. 4B, utilizing an etchant of $NH_4OH/H_2O_2/H_2O$ (composite rate, 1:1:5) which is at a temperature of 18–40 degree Celsius. This results in the top 2B and side walls 2C of each aluminum wired layer 2A the bottom 2D of each formed with the metal barrier layer 5A being coated with the first Al-Ti compound metal layers 4A and with the silicon substrate being exposed where the titanium layer 3 was etched away, as illustrated at FIG. 4C.

The fourth embodiment of the present invention provides a structure having an Al-Ti compound metal layer 5A and a metal barrier layer 5, such as, for example TiW, sequentially formed at the bottom 2D of each aluminum wired layers 2A where the aluminum wired layer 2A is formed on the silicon substrate and having a first and second Al-Ti compound metal layer 4A, 4B formed on the top 2B and both side walls 2C of each aluminum wired layer 2A.

Figure 5A:
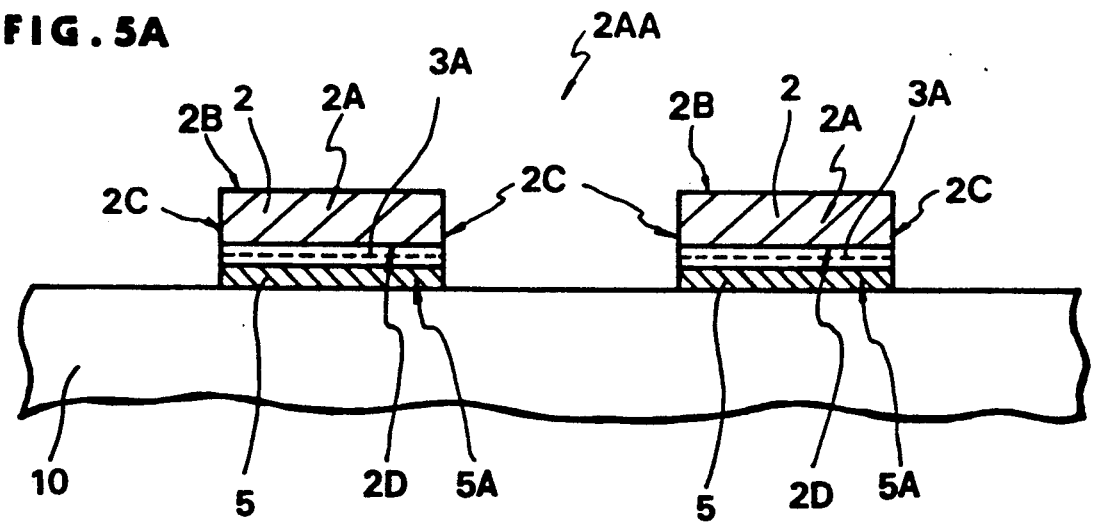
FIGS. 5A through 5C illustrate cross sectional views of partially completed aluminum wired layer utilizing the process steps according to a fourth embodiment of the present invention for manufacturing an aluminum wired layer.
Figure 5B:
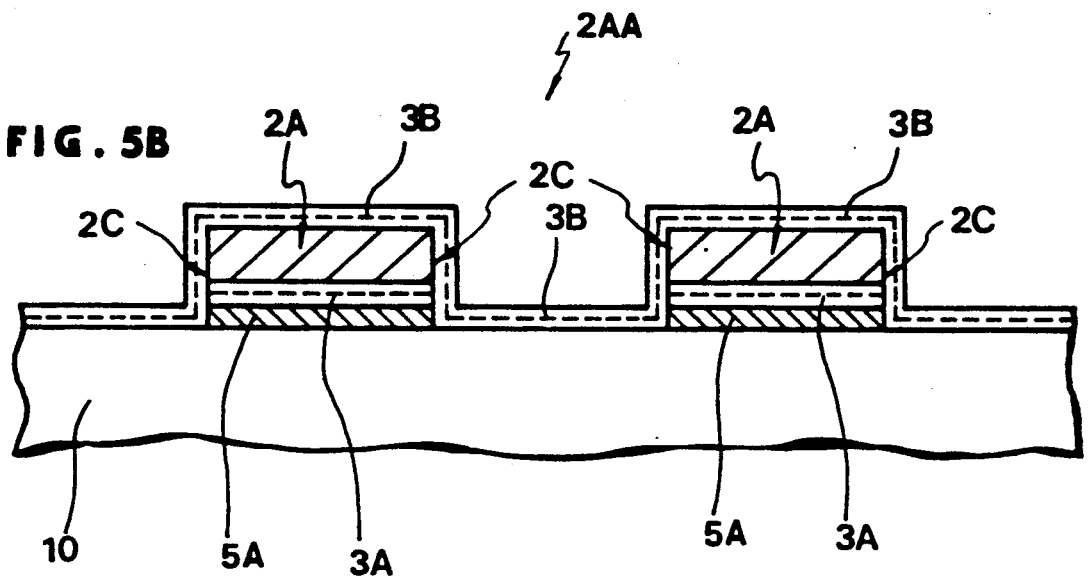
Figure 5C:
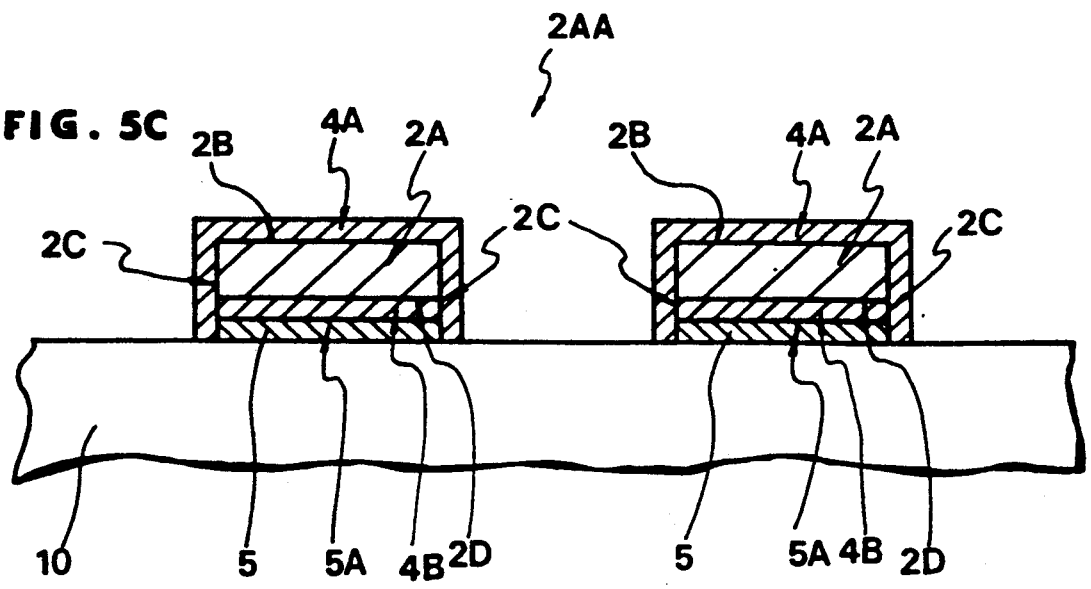

FIGS. 5A through 5C are sectional views of a partially completed aluminum wired layer utilizing the process steps according to a fourth embodiment of the present invention for manufacturing a aluminum wired layer on a silicon substrate 10. The aluminum wired layer produced by the second embodiment of present invention effectively restrains previously mentioned electromigration phenomenon and hillock formation in the aluminum wired layer as compared to the prior art aluminum wired layer described in the opening paragraph.

To form a plurality of aluminum wired layers 2AA, a metal layer 5, a first titanium layer 3A and an aluminum layer 2 are sequentially deposited over the silicon substrate 10. By the mask patterning process, the aluminum layer 2, the first titanium layer 3A and the metal layer 5 are etched to provide a plurality of aluminum wired layers 2AA, with each aluminum wired layer 2A being spaced apart relative to each other and having a top 2B, bottom 2D and both side walls 2C of the each aluminum wired layer 2A, and to provide a metal barrier layer 5A formed at the bottom 2D of the each aluminum wired layer 2A as illustrated at FIG. 5A.

FIG. 5B illustrates a second titanium layer 3B deposited on the entire surface of the structure described in connection with FIG. 5A.

The first 3A and second 3B titanium layers are heated in a furnace, not shown, at a temperature of 400–500 degree Celsius simultaneously with application of conditioning gases, such as for example, a nitrogen-hydrogen gas mixture, nitrogen gas or argon gas, to cause the titanium in the first 3A and second 3B titanium layers to react with aluminum 2 in the each aluminum wired layer 2A of the plurality of aluminum wired layers 2AA. First and second Al-Ti compound metal layers 4A, 4B are thus formed on each aluminum wired layer 2A of the plurality of aluminum wired layers 2AA, and on each metal barrier layer 5A, respectively, i.e. layers 4A, 4B cover the top 2B and side walls 2C and the bottom 2D of each aluminum wired layer 2A, and also cover the metal barrier layer 5A positioned between the silicon substrate 10 and the Al-Ti compound metal layer 4B formed at the bottom 2D of each aluminum wired layer 2A. The titanium layer 3B which was deposited on the exposed portion of the silicon substrate 10, remains, as illustrated at FIG. 3C.

In order to selectively remove the second titanium layer 3B which remains on the silicon substrate 10, an etching process is performed on the resultant structure of FIG. 3C, utilizing an etchant of $NH_4OH/H_2O_2/H_2O$ (composite rate, 1:1:5) which is at a temperature of 18-40 degree Celsius. This results in the top 2B, bottom 2D and side walls 2C of each aluminum wired layer 2A being coated with the Al-Ti compound metal layers 4A, 4B and the silicon substrate 10 being exposed where the second titanium layer 3B was etched away, as illustrated at FIG. 5C.

As described above, with the improvement of a aluminum wired layer for connecting device to device in semiconductor device according to the present invention, it is possible to prevent hillock formation at the top and side walls of the aluminum wired layer, and to prevent the electromigration phenomenon in the aluminum wired layer, thereby reducing the deterioration of the desireable properties of the semiconductor device.

The foregoing description of the preferred embodiment has been presented for the purpose of illustration and description. It is not intended to limit the scope of this invention. Many modifications and variations are possible in the light of the above teaching. It is intended that the scope of the invention be defined by the claims.

What is claimed is:

1. A method for manufacturing an aluminum wired layer for interconnecting device to device comprising a plurality of aluminum wired layers formed on an insulating layer of a semiconductor device, to prevent the formation of hillock on the surface of each aluminum wired layer during heat treatment, and to prevent electromigration phenomenon in each aluminum wired layer when the semiconductor device is in operation, wherein the improvement of the aluminum wired layer comprises:

depositing an aluminum layer on the insulating layer;

etching the aluminum layer deposited on the surface of the insulating layer by a mask patterning process to form a plurality of aluminum wired layers on the insulating layer with each aluminum wired layer being spaced apart relative to each other on the insulating layer exposed by the formation of the plurality of aluminum wired layers formed by the mask patterning process, and with each aluminum wired layer having a top and side walls;

depositing a titanium layer on the entire surface of the structure including each aluminum wired layer and the exposed portion of the insulating layer;

heating the titanium layer thereby reacting the titanium of the titanium layer positioned on each aluminum wired layer with the aluminum of each aluminum wired layer, to provide a first Al-Ti compound metal layer on the top and side walls of each aluminum wired layer; and selectively removing the titanium layer remaining on the exposed portion of the insulating layer by etching the remaining titanium layer in an etchant of $NH_4OH/H_2O_2/H_2O$ having a temperature of about 18°-40° C.

2. The method of claim 1, which further comprises heating the titanium layer at a temperature of 400°-500° C. simultaneously with application of conditioning gases, wherein the conditioning gas is selected form the group consisting of a nitrogen-hydrogen gas mixture, a nitrogen gas, or an argon gas.

3. The method of claim 1, wherein the etchant $NH_4OH/H_2O_2/H_2O$ has a composite ratio of 1:1:5 and a temperature of 18°-40° C.

4. A method for manufacturing an aluminum wired layer for interconnecting device to device comprising a plurality of aluminum wired layers formed on an insulating layer of a semiconductor device, to prevent the formation of hillock on the surface of each aluminum wired layer during heat treatment, and to prevent electromigration phenomenon in each aluminum wired layer when the semiconductor device is in operation, wherein the improvement of the aluminum wired layer comprises:

sequentially depositing a first titanium layer and an aluminum layer on the insulating layer;

etching the aluminum layer and the first titanium layer deposited on the surface of the insulating layer by a mask patterning process to form a plurality of aluminum wired layers on the insulating layer, with each aluminum wired layer being spaced apart relative to each other on the insulating layer exposed by the formation of the plurality of aluminum wired layers by the mask patterning process, and with each aluminum wired layer having a top, a bottom and side walls;

depositing a second titanium layer on the entire surface of the structure including each aluminum wired layer, and on the exposed portion of the insulating layer;

heating the first and second titanium layers thereby reaching the titanium of the first and second titanium layers positioned on each aluminum wired layer and at the bottom thereof with the aluminum of each aluminum wired layer, to provide a first Al-Ti compound metal layer on the top and side walls of each aluminum wired layer, and to provide a second Al-Ti compound metal layer at the bottom thereof; and selectively removing the second titanium layer remaining on the exposed portion of the insulating layer by etching the remaining second titanium layer in an etchant of $NH_4OH/H_2O_2/H_2O$ having a temperature of about 18°-40° C.

5. The method of claim 4, which further comprises heating the first and the second titanium layers at a temperature of 400°-500° C. simultaneously with application of conditioning gases, wherein the conditioning gas is selected from the group consisting of a nitrogen-hydrogen gas mixture, a nitrogen gas, or an argon gas.

6. The method of claim 4, wherein the etchant $NH_4OH/H_2O_2/H_2O$ has a composite ratio of 1:1:5 and a temperature of 18°-40° C.

7. A method for manufacturing an aluminum wired layer for interconnecting device to device, comprising a plurality of aluminum wired layers formed on a silicon substrate of a semiconductor device, to prevent the formation of a pit occurring at a junction between said silicon substrate and each aluminum wired layer during the treatment, and to prevent electromigration phenomenon in each aluminum wired layer when the semiconductor device is in operation, wherein the improvement of aluminum wired layer comprises:

sequentially depositing a metal layer and an aluminum layer on the silicon substrate;

etching the aluminum layer and the metal layer deposited on the surface of the silicon substrate by a mask patterning process to form a plurality of aluminum wired layers, with each aluminum wired layer being positioned on a metal barrier layer and spaced apart relative to each other on the silicon substrate exposed by the formation of the plurality aluminum wired layers by the mask patterning process, and with each aluminum wired layer having atop, a bottom and side walls;

depositing a titanium layer on the entire surface of the structure including on each aluminum wired layer and on the exposed portion of the silicon substrate;

heating the titanium layer thereby reacting the titanium on the titanium layer positioned on each aluminum wired layer with the aluminum of each aluminum wired layer to provide a first Al-Ti compound metal layer on the top and side walls; and selectively removing the remaining titanium layer on the exposed portion of the silicon substrate by etching the remaining titanium layer in an etchant of $NH_4OH/H_2O_2/H_2O$ having a temperature of about 18°–40° C.

8. The method of claim 7, which further comprises heating the titanium layer at a temperature of 400°–500° C. simultaneously with application of conditioning gases, wherein the conditioning gas is selected from the group consisting of a nitrogen-hydrogen gas mixture, a nitrogen gas, or an argon gas.

9. The method of claim 7, wherein the etchant $NH_4OH/H_2O_2/H_2O$ has a composite ratio of 1:1:5 and a temperature of 18°–40° C.

10. A method for manufacturing an aluminum wired layer for interconnecting device to device, comprising a plurality of aluminum wired layers formed on a silicon substrate of a semiconductor device to prevent the formation of a pit occurring at a junction between the silicon substrate and each aluminum wired layer during heat treatment and to prevent electromigration phenomenon in each aluminum wired layer when the semiconductor device is in operation, wherein the improvement of the aluminum wired layer comprises:

sequentially depositing a metal layer, a first titanium layer and an aluminum layer on the silicon substrate;

etching the aluminum layer, the first titanium layer and the metal layer deposited on the surface of the silicon substrate by a mask patterning process to form a plurality of aluminum wired layers on the silicon substrate, with each aluminum wired layer being positioned on a metal barrier layer and spaced apart relative to each other on the silicon substrate exposed by the formation of the plurality of aluminum wired layers by the mask patterning process, and with each aluminum wired layer having a top, a bottom and side walls;

depositing a second titanium layer on the entire surface of the structure including on each aluminum wired layer and on the exposed portion of the silicon substrate;

heating the first and second titanium layers thereby reacting the titanium of the first and second titanium layers positioned on each aluminum wired layer and at the bottom thereof with the aluminum of each aluminum wired layer, to provide a first Al-Ti compound metal layer on the top, side walls and a second Al-Ti compound metal layer on the bottom of each aluminum wired layer; and selectively removing the second titanium layer remaining on the exposed portion of the silicon substrate by etching the remaining second titanium layer in an etchant of $NH_4OH/H_2O_2/H_2O$ having a temperature of about 18°–40° C.

11. The method of claim 10, which further comprises heating the first and second titanium layers at a temperature of 400°–500° C. simultaneously with application of conditioning gases, wherein the conditioning gas is selected from the group consisting of a nitrogen-hydrogen gas mixture, a nitrogen gas, or an argon gas.

12. The method of claim 10, wherein the etchant $NH_4OH/H_2O_2/H_2O$ has a composite ratio of 1:1:5 and a temperature of 18°–40° C.

* * * * *